United States Patent [19]

Hunt et al.

[11] 4,396,998

[45] Aug. 2, 1983

[54] THERMALLY REPROGRAMMABLE MEMORY ARRAY AND A THERMALLY REPROGRAMMABLE MEMORY CELL THEREFOR

[75] Inventors: Robert N. Hunt, Claysville; George N. Ong, Coraopolis, both of Pa.

[73] Assignee: Mobay Chemical Corporation, Pittsburgh, Pa.

[21] Appl. No.: 181,572

[22] Filed: Aug. 27, 1980

[51] Int. Cl.³ .............................................. G11C 11/21
[52] U.S. Cl. .................................... 365/148; 365/100
[58] Field of Search ................. 365/94, 100, 103, 104, 365/105, 148

[56] References Cited

U.S. PATENT DOCUMENTS

| | | | |
|---|---|---|---|
| 3,719,933 | 3/1973 | Wakabayashi et al. | 365/148 |
| 3,733,690 | 5/1973 | Rizzi et al. | 365/104 |
| 3,744,036 | 7/1973 | Frohman-Bentchkowsky | 365/185 |
| 3,826,573 | 7/1974 | Heinzer | 365/100 |
| 3,938,108 | 2/1976 | Salsbury | 365/104 |
| 4,238,839 | 12/1980 | Redfern et al. | 365/104 |

OTHER PUBLICATIONS

IBM Technical Disclosure Bulletin-vol. 17, No. 17, Apr. 1975, p. 3279.

Electronics-Jun. 19, 1980, p. 42, "All Polymer Part Acts as Circuit Breaker".

*Primary Examiner*—James W. Moffitt
*Attorney, Agent, or Firm*—Gene Harsh; Lawrence S. Pope; Thomas W. Roy

[57] ABSTRACT

An electrically programmable memory cell comprises two terminals, a unidirectional and/or controllable semiconductor device having anode and cathode regions and a programmable resistor, said anode and cathode regions of the semiconductor device and the programmable resistor being connected in series between the terminals. The programmable resistor comprises a mixture of finely divided metallic material dispersed in a thermoplastic resin. The programmable resistor is initially substantially nonconductive (having a resistivity, for example, in excess of 1 mega ohms per cubic cm). By forcing a sufficient current through the terminals for a period of time, the resistance of the programmable resistor drops drastically to the extent that it may be considered a conductor (having a resistivity, for example, of less than 100 ohms per cubic cm). The programmable resistor may be returned to its substantially nonconductive condition by heating to a temperature above which the memory cell is normally used and below which the semiconductor device is damaged. The semiconductor device may be a transistor, for example, a field effect transistor, a diode or the like.

18 Claims, 3 Drawing Figures

THERMALLY REPROGRAMMABLE MEMORY ARRAY AND A THERMALLY REPROGRAMMABLE MEMORY CELL THEREFOR

BACKGROUND OF THE INVENTION

1. Field of the Invention

This invention relates to the field of electrically programmable and thermally reprogrammable read-only memories.

2. Prior Art

The electrically programmable and reprogrammable read-only memories of the semiconductor-type comprising semiconductor integrated circuits in which the programmable memory element is a floating gate storage transistor are illustrated, for example, in U.S. Pat. Nos. 3,744,036 and 3,938,108. Non-reprogrammable semiconductor memories are known to include devices having a fusible link usually in a transistor emitter lead. A fusible link is fabricated by using a special material such as polycrystalline silicon, nichrome or titanium-tungsten. Programming the memory cell associated with a given fusible link is accomplished by passing an excessive amount of current through the fusible link causing it to open. In another form of nonreprogrammable read-only memory, an excess current is applied to the base collector emitter region forcing an internal breakdown in a base emitter junction. A breakdown melts nearby chip metallization and aluminum flows into the junction causing a short-circuit.

The present invention describes a memory cell and a memory array comprised thereof having as a programmable element a mixture of finely divided metallic material dispersed in a thermoplastic resin. The programmable element is initially substantially nonconductive and may be rendered or programmed conductive by forcing an electrical current therethrough for a sufficient period of time. The programmable element may be returned to its substantially nonconductive state by heating to a temperature relatively high with respect to the normal temperature use of the programmed memory cell.

SUMMARY OF THE INVENTION

An electrically programmable memory cell comprises two terminals, a unidirectional and/or controllable semiconductor device having anode and cathode regions and a programmable resistor, said anode and cathode regions of the semiconductor device and the programmable resistor being connected in series between the terminals. The programmable resistor comprises a mixture of finely divided metallic material dispersed in a thermoplastic resin. The programmable resistor is initially substantially nonconductive (having a resistivity, for example, in excess of 1 mega ohms per cubic cm). By forcing a sufficient current through the terminals for a period of time, the resistance of the programmable resistor drops drastically to the extent that it may be considered a conductor (having a resistivity, for example, of less than 100 ohms per cubic cm). The programmable resistor may be returned to its substantially nonconductive condition by heating to a temperature above which the memory cell is normally used and below which the semiconductor device is damaged. The semiconductor device may be a transistor, for example, a field effect transistor, a diode or the like.

A memory array incorporating memory cells as above described comprises a plurality of word lines and a plurality of bit lines. A plurality of memory cells as above described couple each word line with each bit line. The memory cells of the memory array may be selectively programmed and once programmed, information stored by the programming may be read from the array. Further, the array may be reprogrammed by first heating the entire array.

DESCRIPTION OF THE PREFERRED EMBODIMENTS

Figure 1:
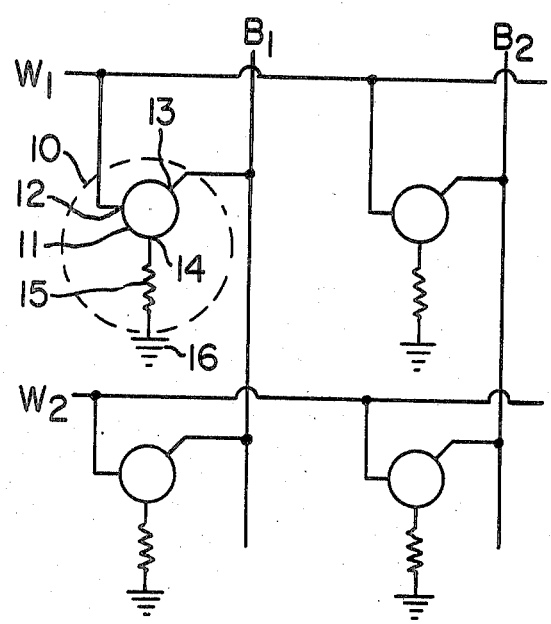
FIG. 1 is a circuit diagram illustrating a portion of a memory array built in accordance with the present invention wherein a controllable semiconductor device is utilized with each memory cell.

Referring to FIG. 1, a portion of a memory array comprising word lines W1 and W2 and bit lines B1 and B2 and memory cells 10 located at each intersection of a word line and a bit line is illustrated. Memory cells 10 are identical and each comprises a controllable semiconductor device, for example, a transistor 11 having a control or gate terminal 12 and input/output terminals 13 and 14. Each memory cell also comprises a programmable resistor 15.

In the array illustrated in FIG. 1, the control or gate terminal of the transistor is connected to the word line. The input/output terminals of the transistor are connected in series with the programmable resistor between the bit line and a common or ground line 16.

While only a portion of an array is illustrated in FIG. 1, it should be apparent that the array may be of any size and contain any number of word lines and bit lines each coupled by a memory cell.

In order to program the array of FIG. 1, consider that all programmable resistors such as 15 are in their substantially nonconductive or "0" state. Assume that it is necessary to write a "1" into the memory cell coupling word line W1 with bit line B1. In order to accomplish this, a signal is applied to W1 which will place transistor 11 in its conductive state. A direct voltage is then applied to line B1 of sufficient magnitude and for sufficient time to force a current through the programmable resistor and thus cause the programmable resistor to become conductive. Thus, by the selective application of voltages to the word and bit lines, the array of FIG. 1 may be programmed with "1"s and "0"s as desired. Once a memory element is programmed with a "1", it will remain programmed indefinitely. The memory array may be reprogrammed by first heating the array to a temperature in excess of its normal use temperatures, for example, room temperature, and to a temperature below which the transistor is damaged. In this way, all of the programmable resistors are returned to their substantially nonconductive state. Thereafter, the array is reprogrammed as it would be initially programmed.

In order to read information from the array of FIG. 1, consider that it is necessary to determine the state of information stored in the memory cell coupling word line W1 and bit line B1. A voltage is applied to line W1 thereby turning on the transistor. If a "1" has been stored within the memory cell, a current path will exist from line B1 through the transistor and programmable resistor to the ground or a common terminal. The existence of this condition may be sensed by a commonly known means. If the programmable resistor is in a "0" state, no current path will exist between line B1 and ground. Note that the voltage utilized to read-out information from the array of FIG. 1 must be of smaller magnitude than that voltage utilized to program the array in order to avoid destruction of the information in the array.

Figure 2:
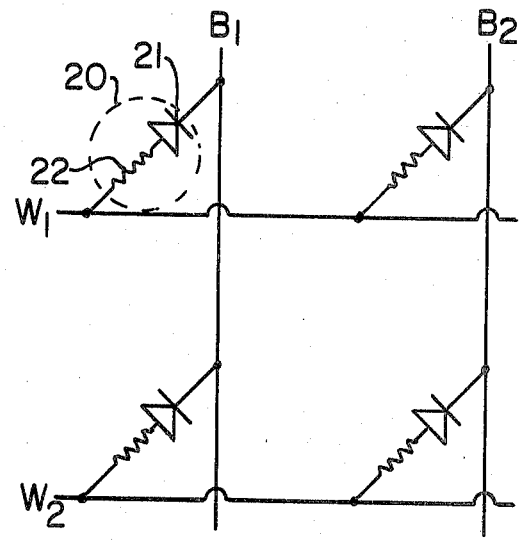
FIG. 2 is a circuit diagram for an alternate embodiment of a memory array wherein a diode is utilized with each memory cell.

Referring now to FIG. 2, a portion of a memory array comprising word lines W1 and W2 and bit lines B1 and B2 is illustrated. The memory cells 20 comprise a diode 21 and a programmable resistor 22 in series between the crossing word and bit lines. The diode is oriented in the memory cell such that it will pass a positive current in the direction from the word line to the bit line.

In order to program the array of FIG. 2, consider first that all the memory cells are in the "0" state, that is, the programmable resistors are in their substantially nonconductive state. Assume further that it is necessary to program a "1" into the memory cell. This may be accomplished by applying a negative voltage to line B1 and grounding line W1. The other word lines in the array should be maintained at a negative voltage to prevent passage of current through the other memory cells located along the line B1. When the negative voltage is applied to line B1, a current will be forced from line W1 through the programmable resistor 22 and diode 21 provided the magnitude of the voltage applied is sufficient. With sufficient time, the programmable resistor will become substantially conductive. Once this condition is achieved, it will exist indefinitely. In similar manner, the remaining memory cells within the array may be programmed.

In order to read information from the memory cell coupling word line W1 and bit line B1, a negative voltage is applied to line B1 while line W1 is grounded. The other word lines should be maintained at a negative voltage in order to avoid passage of current through the other memory cells located along bit line B1. If a "1" is stored within the memory cell, a passage of current will be noted through line W1 and B1, since diode 21 will conduct. It is, of course, necessary that while reading information from the array, the negative voltage utilized to sense the state of the programmable resistor must be of small enough magnitude to avoid destruction of information in the array. The voltage used for reading is much smaller than that used for programming.

Figure 3:
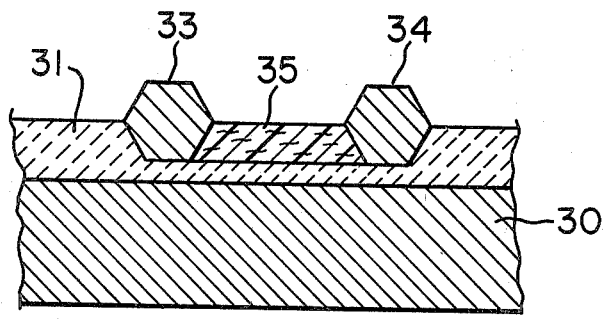
FIG. 3 is a cross-sectional view of a portion of an integrated circuit embodying a memory cell according to this invention.

FIG. 3 illustrates a possible physical embodiment of the programmable resistor positioned on an integrated circuit chip. The substrate of the chip 30 has insulating coating or layer 31. Metal contacts 33 and 34 are spaced and positioned to be insulated from the substrate. Between the metal contacts is deposited the programmable resistor material 35.

The magnitude of the voltage required to program the programmable resistor material, i.e., to make it conductive depends upon the particular composition, and the dimensions of the resistor. We have found that for thin film resistors a voltage of 70–80 VAC per centimeter for approximately 0.01 seconds will suffice wherein the composition of the resistor is in accordance with Example 1.

The preferred thermoplastic materials useful in the practice of the invention are polycarbonates having a weight average molecular weight from 10,000 to 200,000, preferably those with a melt flow rate range of 1 to 24 g/10 min. (ASTM 1238), most preferably a melt flow rate of 3 to 24 g/10 min. and especially a melt flow rate of 6 to 18 g/10 min. Other thermoplastic materials useful in the practice of the invention are those thermoplastic polymers having a melt flow rate of preferably 3 to 24 g/10 min. (ASTM 1238). Exemplary of these thermoplastic polymers are polyethylene terephthalate, polybutylene terephthalate and similar high molecular weight polyester resins.

The polycarbonate resins useful in practice of the invention are produced by reacting di-(monohydroxyaryl)alkanes or dihydroxybenzenes and substituted dihydroxybenzenes with derivatives of the carbonic acids such as carbonic acid diesters, phosgene, bis-chloro-cabonic acid esters of di-(monohydroxyaryl)-alkanes and the bis-chloro-carbonic acid esters of the dihydroxybenzenes and the substituted dihydroxybenzenes.

The two aryl residues of the di-(monohydroxyaryl)alkanes supplied according to the invention can be alike or different. The aryl residues can also carry substituents which are not capable of reacting in the conversion into polycarbonates, such as halogen atoms or alkyl groups, for example, the methyl, ethyl, propyl or tert.-butyl groups. The alkyl residue of the di-(monohydroxyaryl)-alkanes linking the two benzene rings can be an open chain or a cycloaliphatic ring and may be substituted, if desired, for example, by an aryl residue.

Suitable di-(monohydroxyaryl)-alkanes are, for example, (4,4′-dihydroxy-diphenyl)-methane; 2,2′-(4,4′-dihydroxy-diphenyl)-propane; 1,1-(4,4′-dihydroxy-diphenyl)-cyclohexane; 1,1-(4,4′-dihydroxy-3,3′-dimethyl-diphenyl)-cyclohexane; 1,1-(2,2′-dihydroxy-4,4′-dimethyl-diphenyl)-butane; 2,2-(2,2′-dihydroxy-4,4′-di-tert.-butyl-diphenyl)-propane; or 1,1′-(4,4′-dihydroxy-diphenyl)-1-phenyl-ethane; furthermore, methane derivatives which carry besides two hydroxyaryl groups, as alkyl residue with at least two carbon atoms and a second alkyl residue with one or more carbon atoms, such as 2,2-(4,4′-dihydroxy-diphenyl)-butane; 2,2-(4,4′-dihydroxy-diphenyl)-pentane (melting point 149°–150° C.), 3,3-(4,4′-dihydroxy-diphenyl)-pentane; 2,2-(4,4′-dihydroxy-diphenyl)-hexane; 3,3-(4,4′-dihydroxy-diphenyl)-hexane; 2,2-(4,4′-dihydroxy-diphenyl)-4-methylpentane; 2,2-(4,4′-dihydroxy-diphenyl)-heptane; 4,4-(4,4′-dihydroxy-diphenyl)-heptane (melting point 148°–149° C.) or 2,2-(4,4′-dihydroxy-diphenyl)-tri-decane. Suitable di-(monohydroxyaryl)-alkanes, the two aryl residues of which are different are, for example, 2,2-(4,4′-dihydroxy-3′-methyl-diphenyl)-propane and 2,2-(4,4′-dihydroxy-3-methyl-3′-isopropyl-diphenyl)-butane. Suitable di-(monohydroxyaryl)-alkanes, the aryl residues of which carry halogen atoms are, for instance, 2,2-(3,5,3′5′-tetrachloro-4,4′-dihydroxy-diphenyl)-propane; 2,2-(3,5,3′5′-tetrabromo-4,4′-dihydroxy-diphenyl)-propane; (3,3′-dichloro-4,4′-dihydroxy-diphenyl)-methane; and 2,2′-dihydroxy-5,5′-difluoro-diphenyl-methane. Suitable di-(monohydroxyaryl)-alkanes, the alkyl residue of which, linking the two benzene rings, is substituted by an aryl residue are, for instance, (4,4′-dihydroxy-diphenyl)-phenyl-methane and 1,1-(4,4′-dihydroxy-diphenyl)-1-phenyl-ethane.

Suitable dihydroxybenzenes and substituted dihydroxybenzenes are hydroquinone, resorcinol, pyrocatechol, methyl hydroquinone and the like. Other suitable dihydroxyaromatic compounds are 4,4′-dihydroxydiphenylene; 2,2'-dihydroxy-diphenylene; dihydroxy-naphthalene, dihydroxyanthracene and compounds represented by the structural formula:

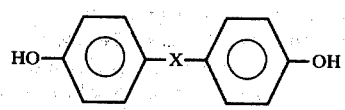

wherein X is

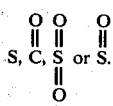

Small amounts of trifunctional or more than trifunctional hydroxy compounds may be reacted in the formation of the polycarbonate resins to branch the polymer chains. Preferably, of between about 0.05 and 2.0 mole percent (relative to diphenols employed), of trifunctional or more than trifunctional compounds, especially compounds with three or more phenolic hydroxyl groups.

Polycarbonates of this type are described, for example, in German Offenlegungsschriften (German Published Specifications) 1,570,533; 1,595,762; 2,116,974; and 2,113,347; British Patent Specification No. 1,079,821 and U.S. Pat. No. 3,544,514 (incorporated herein by reference).

Some of the examples of compounds with three or more than three phenolic hydroxyl groups which can be used are fluoroglucinol; 4,6-dimethyl-2,4,6-tri-(4-hydroxyphenyl)-heptane; 2,4,6-dimethyl-2,4,6-tri-(4-hydroxyphenyl)-heptane; 1,4,5-tri-(4-hydroxyphenyl)-benzene; 1,1,1-tri-(4-hydroxyphenyl)-ethane; tri-(4-hydroxyphenyl)-phenylmethane; 2,2-bis-[4,4-bis-(4-hydroxyphenyl)-cyclohexyl]-propane; 2,4-bis-(4-hydroxyphenyl-isopropyl)-phenyl; 2,6-bis-(2-hydroxy-5'-methyl-benzyl)-4-methylphenyl; 2-(4-hydroxyphenyl)-2-(4-hydroxyphenyl)-propane; hexa-(4-(4-hydroxyphenylisopropyl)phenyl)ortho-terephthalic acid ester; tetra-(4-hydroxyphenyl)-methane; tetra-(4-(4-hydroxyphenyl-isopropyl)-phenoxy)-methane; and 1,4-bis-(4',4''-dihydroxy-triphenyl)-methyl-benzene. Some of the other trifunctional compounds are 2,4-dihydroxybenzoic acid, trimesic acid, cyanuric chloride and 3,3-bis-(4-hydroxyphenyl)-2-oxo-2,3-dihydroindole.

The polycarbonate resins are those having a weight average molecular weight from 10,000 to 200,000 and preferably a melt flow rate range of 1 to 24 g/10 min. (ASTM 1238) and are prepared by methods known to those skilled in the art and more particularly by methods disclosed in U.S. Pat. Nos. 3,028,365; 2,999,846; 3,248,414; 3,153,008; 3,215,668; 3,187,065; 2,964,974; 2,970,137; 2,991,273; and 2,999,835 all incorporated herein by reference.

The metals useful in the practice of the invention are used in finely divided particulate form preferably having a particle size between 1 micrometer and 2 millimeters, more preferably 1 micrometer to 10 micrometers, most preferably 5.5 micrometers to 10 micrometers and must be of a highly conductive nature. Exemplary of such metals are silver, gold, platinum, copper, aluminum, iron and the like.

Preferably, the finely divided metal is present in the resistor composition at a level of 10 to 40 percent by weight and the thermoplastic polymer is present at a level of 60 to 90 percent by weight. More preferably, the metal is present at a level of 20 to 30 percent by weight, and the thermoplastic resin is present at a level of 80 to 70 percent by weight.

EXAMPLE

A polycarbonate resin having a melt flow of 6-12 g/10 min. based upon the reaction product of bisphenol A and phosgene was tumble blended with aluminum flake having a particle size of 2 millimeters until homogeneous. Sufficient aluminum powder was incorporated into the polycarbonate to provide for 30 percent aluminum based upon the weight of the total composition. The polycarbonate/aluminum dispersion was formed into a homogeneous film which had a conductance in excess of one mega ohm per cubic cm. Upon the application of 115 volts alternating current across the filter conductance changed to less than 100 per cubic cm.

Upon heating the film at 70° C. for 10 minutes, the film returned to a resistance in excess of one mega ohm per cubic cm.

Having thus described our invention in the detail and with the particularity required by the patent laws, what is desired protected by Letters Patent is set forth in the following claims.

What is claimed is:

1. A memory cell comprising first and second terminals, a semiconductor device having an anode and cathode region, an erasable programmable resistor, said anode and cathode regions of the semiconductor device arranged in series with said erasable programmable resistor between the first and second terminals, said erasable programmable resistor comprising a mixture of finely divided conductive metallic material dispersed in a thermoplastic resin wherein (a) said erasable programmable resistor may be rendered conductive by applying a voltage of sufficient magnitude for a sufficient time to force a current through said erasable programmable resistor, (b) said erasable programmable resistor remains conductive in the absence of additional voltage and (c) said erasable programmable resistor may be rendered substantially nonconductive by heating to a temperature in excess of the normal use temperature of said erasable programmable resistor for a sufficient period of time.

2. The memory cell of claim 1 wherein said thermoplastic resin is a polycarbonate resin.

3. The memory cell of claim 2 wherein said polycarbonate resin has a melt flow of 6 to 18 g/10 min.

4. The memory cell of claim 1 wherein said finely divided metallic material has a particle size up to about 2 millimeters.

5. The memory cell of claim 4 wherein said particle size is 1 micrometer to 10 micrometers.

6. The memory cell of claim 5 wherein said particle size is 5.5 micrometers to 10 micrometers.

7. The memory cell of claim 1 wherein said metallic material is selected from the group consisting of silver, gold, platinum, copper, aluminum and iron.

8. The memory cell of claim 1 wherein said erasable programmable resistor is comprised of 10 to 40 percent by weight of finely divided conductive material and 60 to 90 percent by weight thermoplastic resin.

9. A memory array comprising a plurality of word lines, a plurality of bit lines, at least one common line, a plurality of memory cells each comprising an erasable programmable resistor and a transistor having a gate and input/output terminals, said gate terminal being coupled to one of said word lines, said input/output terminals being connected in series with said erasable programmable resistor to couple one of said bit lines to said common line and voltage means for applying a voltage to at least one of said bit lines of sufficient magnitude to cause said erasable programmable resistor to become conductive and remain conductive in the absence of additional voltage, and wherein said erasable programmable resistor may be rendered substantially nonconductive by heating to a temperature in excess of the normal use temperature of said erasable programmable resistor for a sufficient period of time.

10. The memory array of claim 9 wherein said erasable programmable resistor is comprised of a mixture of finely divided conductive metallic material dispersed in a thermoplastic resin.

11. The memory array of claim 9 wherein said thermoplastic resin is a polycarbonate resin.

12. The memory array of claim 11 wherein said polycarbonate resin has a melt flow of 6 to 18 g/10 min.

13. The memory array of claim 9 wherein said finely divided metallic material has a particle size up to about 2 millimeters.

14. The memory array of claim 13 wherein said particle size is 1 micrometer to 10 micrometers.

15. The memory array of claim 14 wherein said particle size is 5.5 micrometers to 10 micrometers.

16. The memory array of claim 9 wherein said metallic material is selected from the group consisting of silver, gold, platinum, copper, aluminum and iron.

17. The memory array of claim 9 wherein said erasable programmable resistor is comprised of 10 to 40 percent by weight of finely divided conductive material and 60 to 90 percent by weight thermoplastic resin.

18. A memory array comprising a plurality of word lines, a plurality of bit lines and a plurality of memory cells, each memory cell coupled between one of said word lines and one of said bit lines and each memory cell including an erasable programmable resistor in series with a diode whereby voltages of sufficient magnitude may be applied to selected word and bit lines of said array to cause a flow of current in said erasable programmable resistor until it becomes conductive and remains conductive in the absence of additional current, and wherein said erasable programmable resistor may be rendered substantially nonconductive by heating to a temperature in excess of the normal use temperature of said erasable programmable resistor for a sufficient period of time.

* * * * *